US007062178B1

(12) United States Patent
Tagami et al.

(10) Patent No.: US 7,062,178 B1
(45) Date of Patent: Jun. 13, 2006

(54) PHOTODETECTOR ARRAY AND OPTICAL BRANCHING FILTER USING THE ARRAY

(75) Inventors: Takashi Tagami, Osaka (JP); Kenichi Nakama, Osaka (JP); Nobuyuki Komaba, Osaka (JP); Yasunori Arima, Osaka (JP); Yukihisa Kusuda, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 553 days.

(21) Appl. No.: 09/857,634

(22) PCT Filed: Oct. 5, 2000

(86) PCT No.: PCT/JP00/06938

§ 371 (c)(1),
(2), (4) Date: Jun. 7, 2001

(87) PCT Pub. No.: WO01/27573

PCT Pub. Date: Apr. 19, 2001

(30) Foreign Application Priority Data

| Oct. 8, 1999 | (JP) | .................................. 11/287764 |
| Nov. 12, 1999 | (JP) | .................................. 11/322004 |
| Jan. 7, 2000 | (JP) | .............................. 2000/001928 |

(51) Int. Cl.
*H04J 14/02* (2006.01)
*H04B 10/06* (2006.01)

(52) U.S. Cl. ........................ 398/202; 398/79; 398/203; 398/204

(58) Field of Classification Search ................ 398/202, 398/203, 204, 207, 79
See application file for complete search history.

(56) References Cited

U.S. PATENT DOCUMENTS

| 3,535,537 A | 10/1970 | Powell |
| 4,146,332 A | 3/1979 | Moore |
| 5,299,045 A | 3/1994 | Sekiguchi |
| 6,268,943 B1 * | 7/2001 | Kang .......................... 398/26 |
| 6,271,945 B1 * | 8/2001 | Terahara ...................... 398/26 |
| 6,420,985 B1 * | 7/2002 | Toughlian et al. .......... 341/137 |
| 6,580,536 B1 * | 6/2003 | Chraplyvy et al. ........... 398/79 |

FOREIGN PATENT DOCUMENTS

| GB | 862212 | 6/1956 |
| JP | 5-87635 | 4/1993 |
| JP | 9-210783 | 8/1997 |
| JP | 2000-213987 | 8/2000 |

OTHER PUBLICATIONS

PCT International Search Report, Dec. 26, 2000.

* cited by examiner

*Primary Examiner*—Kenneth Vanderpuye
*Assistant Examiner*—Dzung Tran
(74) *Attorney, Agent, or Firm*—RatnerPrestia

(57) ABSTRACT

A light demultiplexer in which a signal and a noise in each channel may be distinctly separated is provided. The light demultiplexer comprises a light-receiving element array for receiving light beams demultiplexed every wavelength from a wavelength multiplexed light beam and arranged in a straight line. The light-receiving element array includes a plurality of light-receiving elements for monitoring signals, and a plurality of light-receiving elements for monitoring noises. The light-receiving elements for monitoring signals and the light-receiving elements for monitoring noise are alternately arrayed in a straight line the direction thereof is the same as that of the arrangement of the demultiplexed light beams.

3 Claims, 15 Drawing Sheets

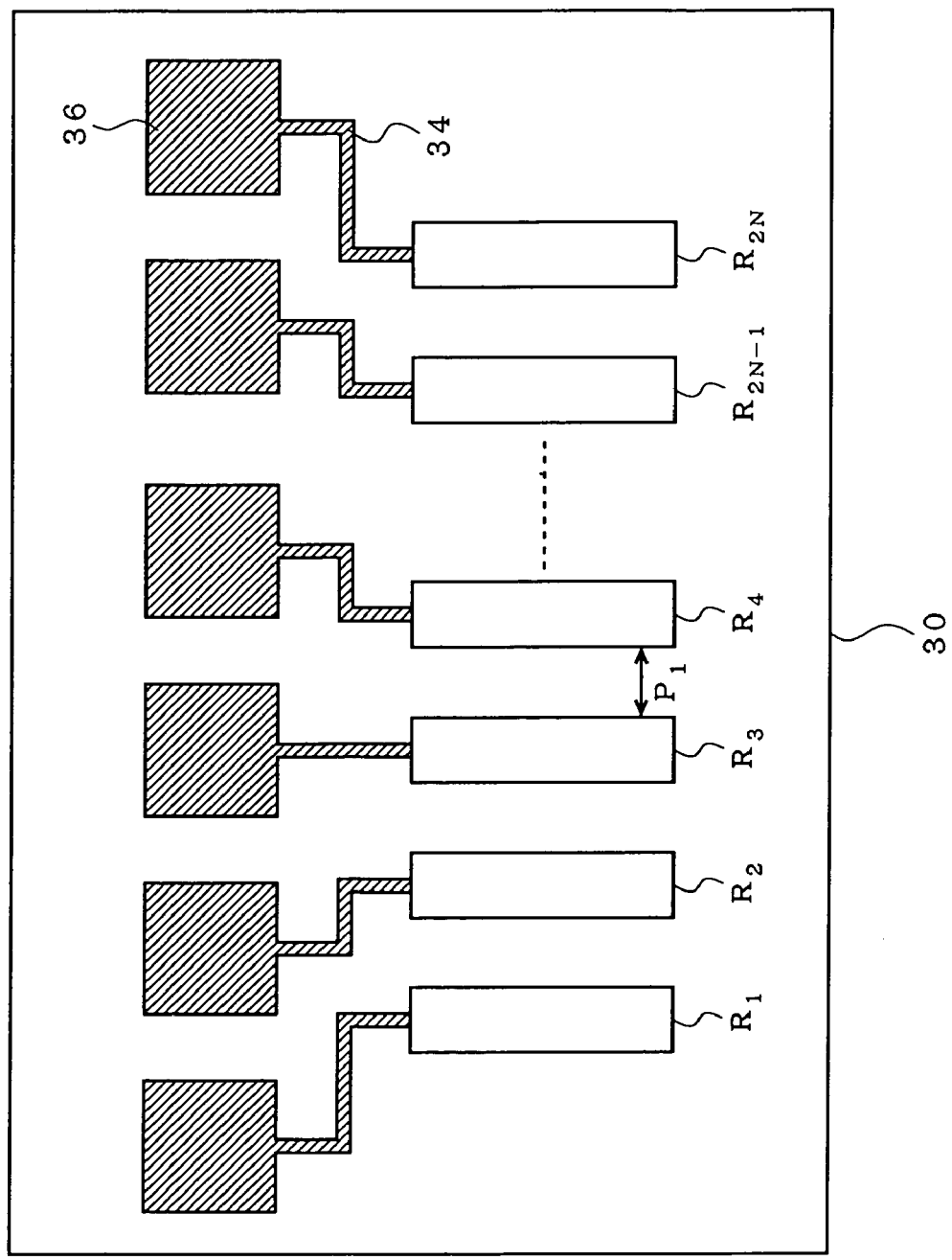
F I G . 7

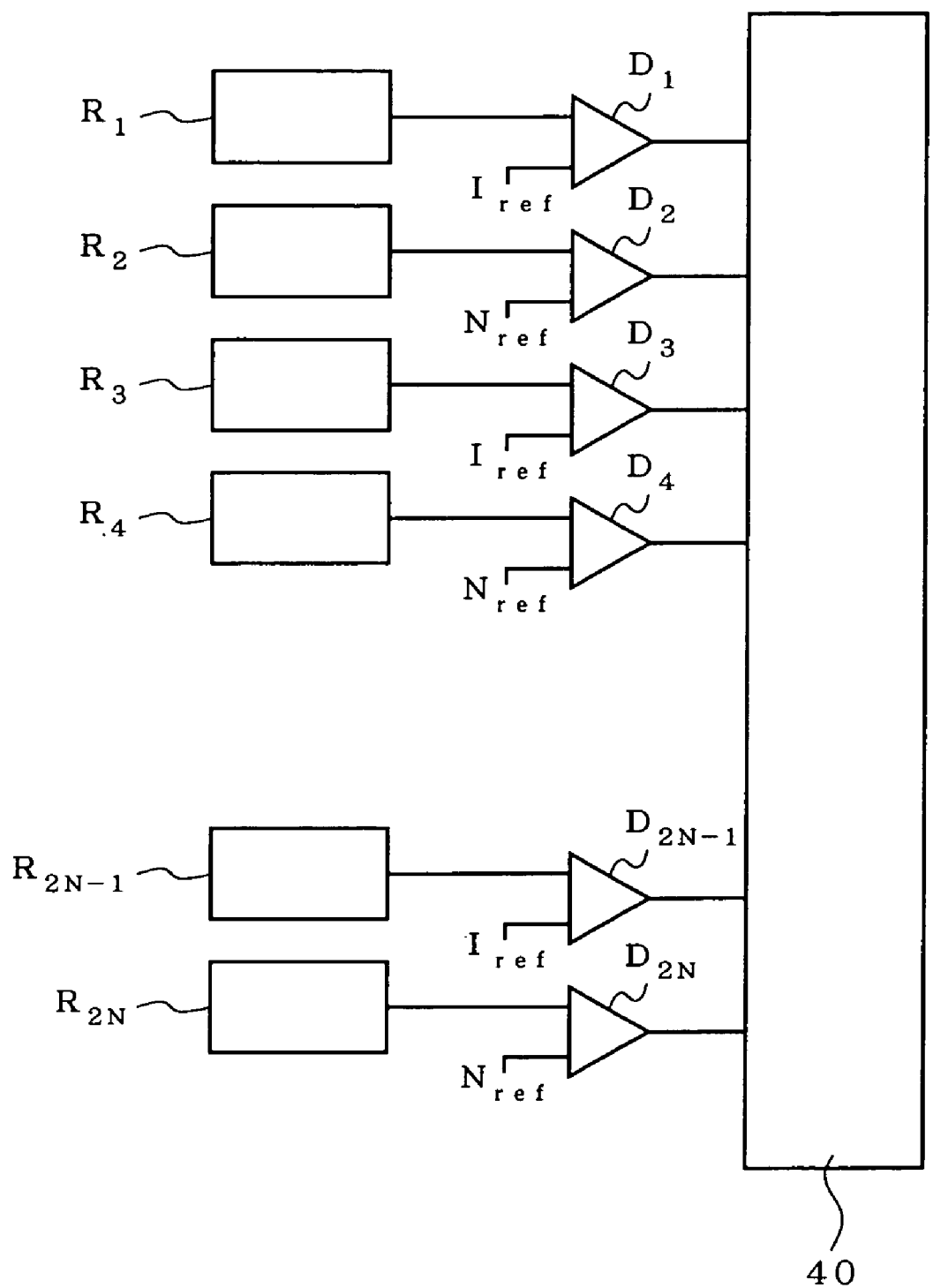
F I G. 9

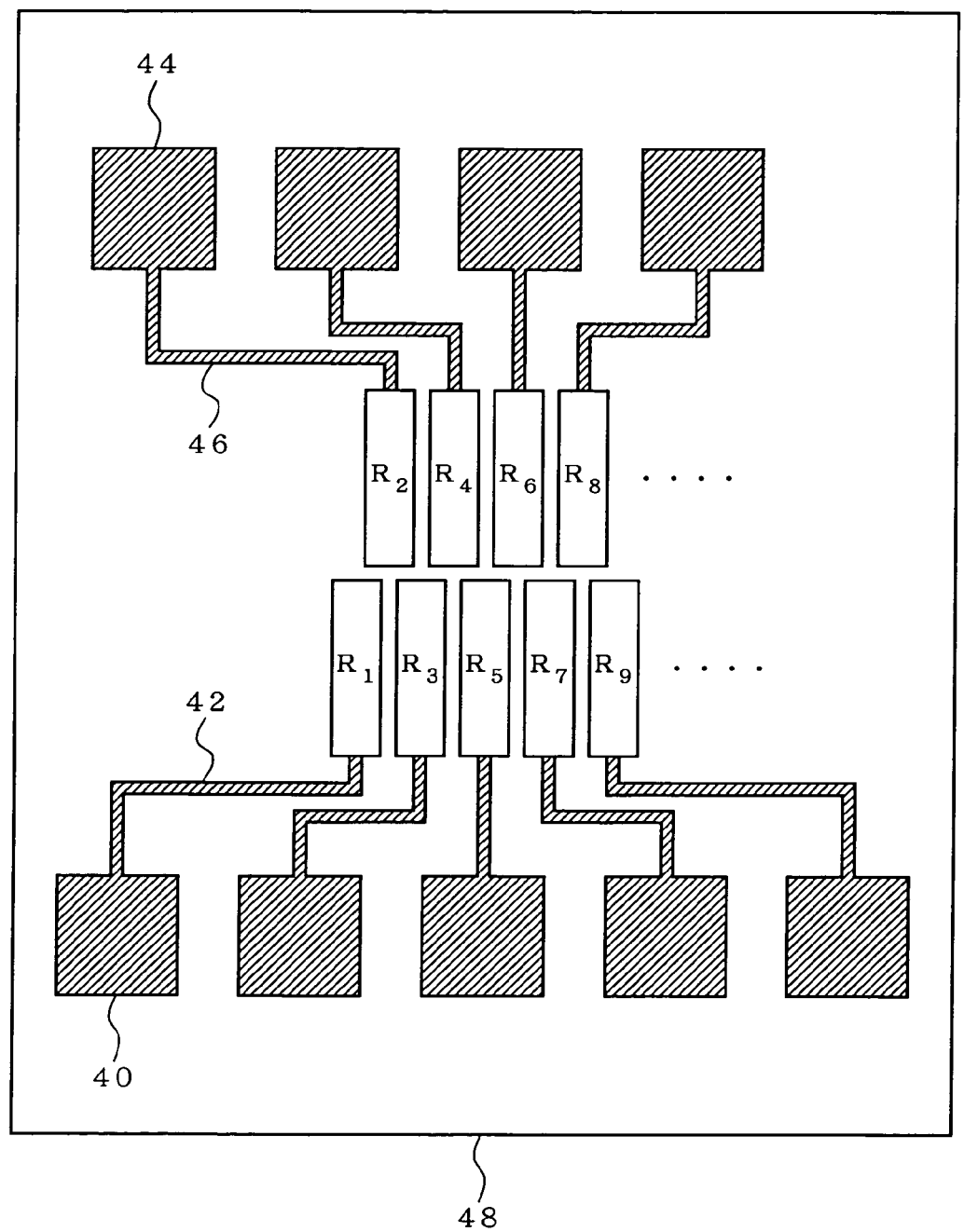
F I G . 1 2

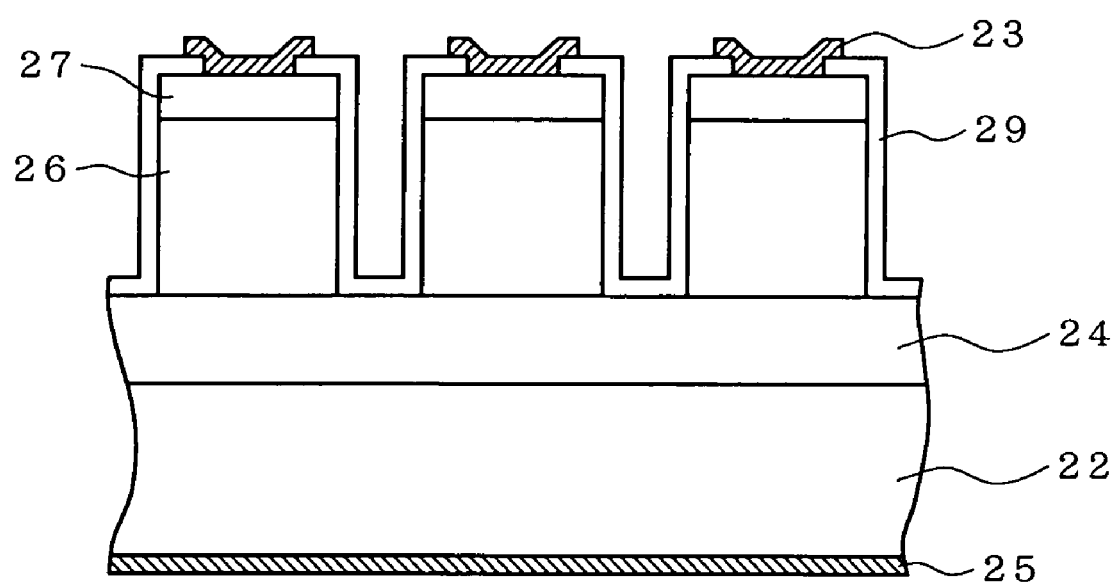
F I G . 1 7

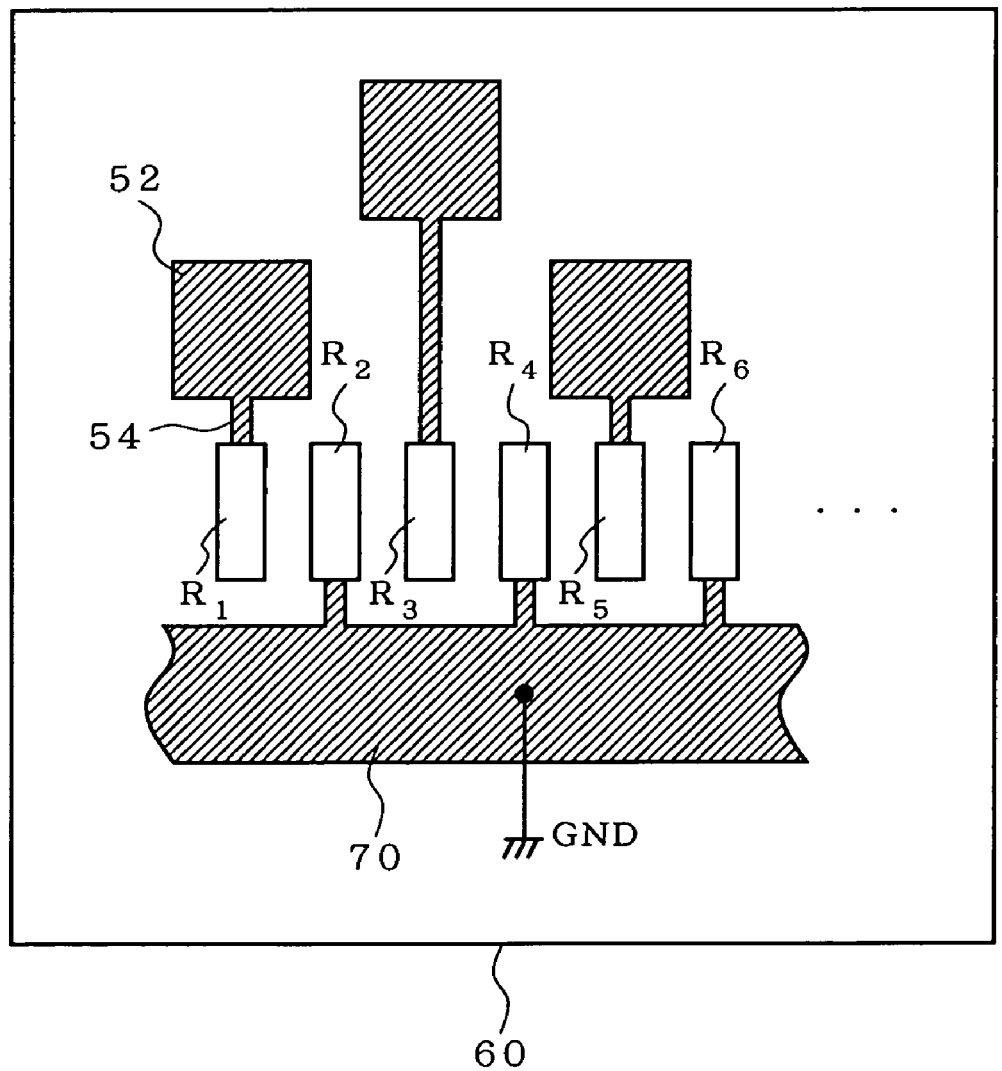
F I G . 1 8

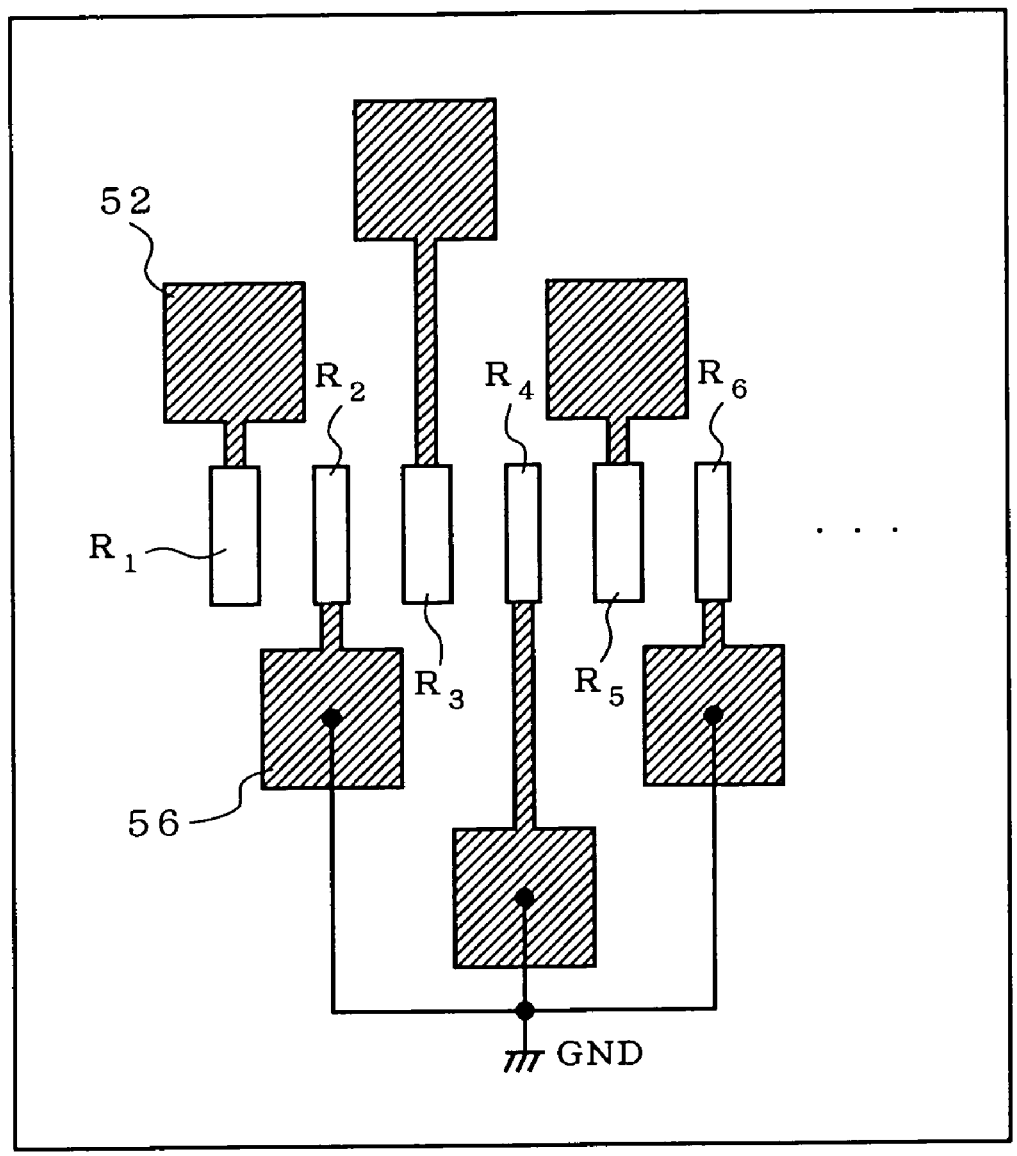
F I G . 1 9

PHOTODETECTOR ARRAY AND OPTICAL BRANCHING FILTER USING THE ARRAY

TECHNICAL FIELD

The present invention relates to an optical demultiplexer for monitoring the spectrum of wavelength multiplexed light, and further relates to a light-receiving element array used in a photodetector of the optical demultiplexer.

BACKGROUND ART

In an optical communication system based on a wavelength multiplexed transmission, for example, an optical demultiplexer is used as a device for demultiplexing the received wavelength multiplexed light beam every wavelength into a plurality of light beams each thereof having one wavelength, and monitoring the spectrum of each of the demultiplexed light beams. The spectrum of each light beam may be detected when each light-receiving element in the array is arranged correspondingly with respect to each light beam.

An example of an optical demultiplexer will now be described with reference to FIG. 1. The optical demultiplexer comprises components such as an input optical fiber 2, a collimator lens 4, a diffraction grating 6, and a photodetector 8. These components are accommodated in three tubular members which are fitted to each other. The input optical fiber 2 consisted of a single core is fixedly coupled to a window 12 for fixing the fiber by means of a fiber coupling member 14, the window 12 being an end face of a transparent tube 10 for accommodating the fiber. The collimator lens 4 are fixed to an end of an intermediate tube 16. The diffraction grating 6 is fixed to an window 20, the window 20 being an end face of a tube 18 for accommodating the diffraction grating. In this optical demultiplexer, the tubes 10 and 18 are fitted to both ends of the intermediate tube 16 so as to be movable in the direction of light axis and rotatable around the light axis for active alignment.

The light beam from the input optical fiber 2 is guided into the optical demultiplexer. At this time, the light beam is diverged due to the numerical aperture of the fiber 2. The divergent beam reaches to the collimator lens 4 and is converged into parallel light beam by the collimator lens. The parallel light beam reaches to the diffraction grating 6 and is demodulated (or isolated) into a plurality light beams every wavelength by the wavelength dispersion characteristic of the diffraction grating 6. The demodulated light beams are converted into convergent light beams, respectively, by the collimator lens 4. These convergent light beams impinge upon the window 12 which is positioned at a focal point of the collimator lens, and are arranged in one line on the window. The photodetection for each light beam may be possible, when the photodetector 8 is secured to the window 20 in such a manner that each light beam impinges correspondingly upon each light-receiving element of the photodetector 8.

There are two types, i.e. a diffusion-type or mesa-type of light-receiving element array for the device. The structure of a diffusion-type light-receiving element array is shown in FIG. 2. An n-type InP layer 24, an i-type InGaAs layer (i.e., a light-absorbing layer) 26, and an n-type InP layer (i.e., a window layer) 28 are stacked in this order on an n-type InP substrate 22. Zn is diffused into the n-type InP layer 28 to form p-type regions 30 in order to fabricate pin-photodiodes. One pin-photodiode constructs one light-emitting element.

The diffusion is isotropic so that Zn diffusion also proceeds in a lateral direction. In this diffusion-type light-receiving element array, therefore, it is limited to decrease the interval of elements, e.g., the limit value is about 50 μm.

The structure of a mesa-type light-emitting element array is shown in FIG. 3. An n-type InP layer 24, an i-type InGaAs layer 26, and a p-type InP layer 27 are stacked in this order on an n-type InP substrate 22. Both the InGaAs layer 26 and InP layer 27 are etched away to isolate the elements in order to fabricate pin-photodiodes. One pin-photodiode constructs one light-receiving element. The mesa-type light-emitting element array has no limitation for the interval of elements, so that the array pitch of the elements may be further decreased.

In the optical communication system based on the wavelength multiplexed transmission, the expansion of spectral width and the shift of wavelength may be occurred, principally in a fiber amplifier of the optical communication system, the spread of spectral width and the shift of wavelength being referred to as noise hereinafter. When such noise is occurred, the following problem is caused. That is, when N-channel light is monitored, in which light beams $L_1$, $L_2$, $L_3$, . . . each having a narrower spectral width are multiplexed as shown in FIG. 4, the strict separation between a signal and a noise in each channel is impossible for the case that light-receiving elements $R_1, R_2, R_3, \ldots, R_N$ for monitoring signals are simply arranged in one line as shown in FIG. 5.

In the case of no occurrence of noise, the light-receiving element array consisting of light-receiving elements $R_1$, $R_2$, $R_3$, . . . arrayed in one line as described with reference to FIG. 5 may be used, but the alignment between the demultiplexed light beams $L_1$, $L_2$, $L_3$, . . . and the light-receiving elements $R_1$, $R_2$, $R_3$, . . . is very difficult.

In the case that a diffusion-type light-receiving element array is used for a photodetector, the carriers caused in one light-receiving element by light absorption are laterally diffused and are transferred to the adjacent light-emitting elements. Therefore, a current flows in the light-emitting elements to which light is not incident upon, resulting in a crosstalk. As a result, the characteristic of the light-emitting element array may be deteriorated. In the case of a mesa-type light-emitting element array, while there is no crosstalk due to the lateral diffusion of carriers like the diffusion-type one, a crosstalk may easily be occurred when a part of light impinged upon one light-receiving element is incident upon the side wall of the adjacent light-receiving element.

DISCLOSURE OF THE INVENTION

A first aspect of the present invention provides a light demultiplexer in which a signal and a noise in each channel may be distinctly separated, and a light-receiving element array used for a photodetector of the light demultiplexer.

In order to distinctly separate a signal and a noise in each channel, the strength of a signal in one channel (or one wavelength) is monitored by one light-receiving element for monitoring a signal, and at the same time, a noise is monitored by at least one light-receiving element for monitoring a noise which is adjacent to said one light-receiving element for monitoring a signal. In this manner, N-channel of signals and noises may be detected by means of about 2N light-receiving elements arrayed in a straight line.

The light-receiving elements for monitoring signals and the light-receiving elements for monitoring noises are alternately arrayed. A signal and noise in each wavelength are detected by adjacent light-receiving elements to monitor the demultiplexed light beams. According to this, if the output from the element for monitoring a signal is decreased and the output from the elements for monitoring a noise is increased, then it is appreciated that any abnormality is caused for the spectrum of demultiplexed light beam. As examples of the abnormality, the peak position of spectrum is shifted to a high wavelength or low wavelength side, the spectral width of spectrum is spread, and the like are estimated. If the output from the element for monitoring a signal is not varied and the output from the element for monitoring a noise is increased, then it is appreciated that the noise in a corresponding channel is increased. In this manner, the shift of the spectral peak and the variation of a noise may be monitored by alternately arraying the element for monitoring a signal and the element for monitoring a noise.

A second aspect of the present invention provides a light demultiplexer in which the alignment between demultiplexed light beams and light-receiving elements may be precisely implemented as well as the resolution of a light demultiplexer may be improved, and a light-receiving element array used for a photodetector of the light demultiplexer. Furthermore, a method for aligning light-receiving elements and demultiplexed light beams.

According to the present invention, one demultiplexed light beam is not received only by one light-receiving element but a plurality of light-receiving elements to compare the output signals from these elements, so that the position of demultiplexed light beams may be aligned with respect to the plurality of the elements.

For that purpose, first light-receiving elements arrayed in a predetermined pitch and in the same direction as that of the arrangement of the demultiplexed light beams, and a plurality of second light-receiving elements arrayed in the same pitch as the predetermined pitch and in the same direction as that of the arrangement of the demultiplexed light beams are arrayed with one-half pitch shifted in an array direction. Also, the output signals from three light-receiving elements which are adjacent to each other in a direction perpendicular to the array direction of the first and second light-receiving elements are used, and the center of a demultiplexed light beam is aligned to the contact point of the three adjacent elements.

According to the present invention, the alignment between a light beam and a light-receiving element may be precisely implemented. Also, the resolution of the light demultiplexer may be improved such as two times by the arrangement of the light-receiving element array.

A third aspect of the present invention provides a light demultiplexer in which a crosstalk between adjacent light-receiving elements may be decreased, and a light-receiving element array used for a photodetector of the light demultiplexer.

According to the present invention, a light-receiving element array for receiving light beams demultiplexed every wavelength from a wavelength multiplexed light beam and arranged in a straight line comprises a plurality of light-receiving elements for monitoring signals, and a plurality of electrode shorted light-receiving elements, wherein the light-receiving elements for monitoring signals and the electrode shorted light-receiving elements are alternately arrayed in a straight line the direction thereof is the same as that of the arrangement of the demultiplexed light beams. As a result, a crosstalk between the light-receiving elements may be decreased.

In order to implement the structure described above in the light-receiving element array, all of the n-type electrodes of the light-receiving elements are commonly connected, the p-type electrodes of the light-receiving elements are commonly connected every other element and are shorted to the common n-type electrodes. Furthermore, the crosstalk may be effectively decreased by providing a light shielding film on the light-receiving surface of the electrode shorted light-receiving element. Also, it may be prevented the light-receiving element array becomes large in order to decrease a crosstalk by making the element area of the electrode shorted light-receiving element smaller than that of the light-receiving element for monitoring a signal.

BRIEF DESCRIPTION OF THE DRAWINGS

FIG. 7 is a plan view of a diffusion-type light-receiving element array chip.

FIG. 9 is a schematic view illustrating a circuitry for detecting N channels of signal and noises which are separated.

FIG. 12 is a plan view of a light-receiving element array of the second embodiment according to the present invention.

FIG. 17 is a cross-sectional view of a mesa-type light-receiving element array provided with electrodes.

FIG. 18 is a plan view of another chip of a light-receiving element array of the third embodiment according to the present invention.

FIG. 19 is a plan view of another chip of a light-receiving element array of the third embodiment according to the present invention.

BEST MODE FOR CARRYING OUT THE INVENTION

FIRST EMBODIMENT

The present embodiment is directed to a light demultiplexer in which a signal and a noise in the wavelength multiplexed light are distinctly separated, and a light-receiving element array used for a photodetector of the light demultiplexer.

Figure 1:
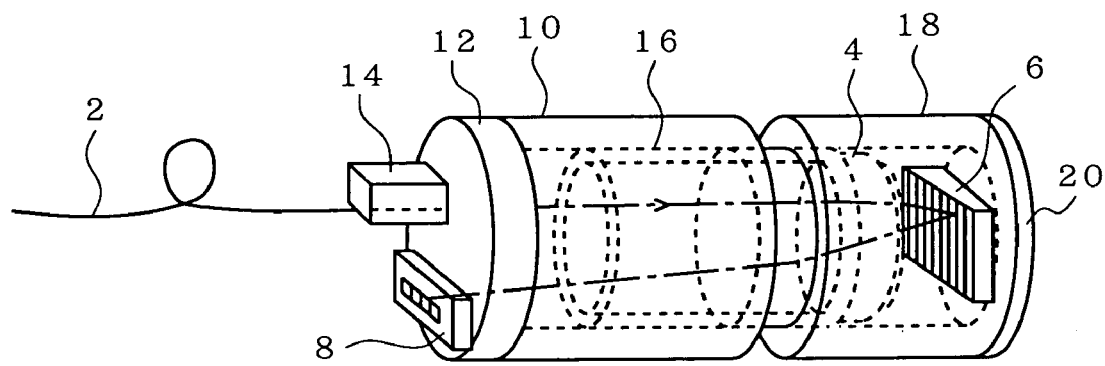
FIG. 1 is a schematic perspective view illustrating the structure of a light demultiplexer.
Figure 6:
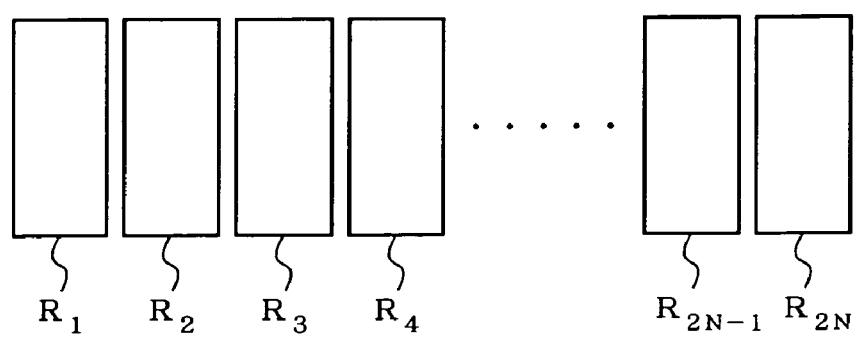
FIG. 6 is a plan view of a light-receiving element array of the first embodiment according to the present invention.

The structure of a light demultiplexer according to the present embodiment is substantially the same as that shown in FIG. 1 except a photodetector. As the photodetector 8, a light-emitting element array according to the present embodiment is used. An example of the light-receiving element array is shown in FIG. 6. For monitoring N channels (N is an integer of 2 or more) of demultiplexed light beams, odd-numbered light-receiving elements for monitoring signals $R_1, R_3, \ldots, R_{2N-1}$ and even-numbered light-receiving elements $R_2, R_4, \ldots, R_{2N}$ for monitoring noises are alternately arrayed. The total number of light-receiving elements is two times the number of demultiplexed light beams, i.e. 2N. According to this light-receiving element array, the element for monitoring a signal monitors the strength of a signal and the element for monitoring a noise monitors the strength of a noise.

For a first channel of demultiplexed light beam, the signal is monitored by the element $R_1$, and the noise by the element $R_2$. For a second channel of demultiplexed light beams, the signal is monitored by the element $R_3$, and the noise by the elements $R_2, R_4$. For a last channel of demultiplexed light beam, the signal is monitored by the element $R_{2N-1}$, and the noise by the elements $R_{2N-2}, R_{2N}$.

For this light-receiving element array, the diffusion-type light-receiving element array as described with reference to FIG. 2 may be used by way of example. As described above, Zn diffusion laterally proceeds in the element, so that the interval of elements may not be narrower than 50 μm, i.e. there is a limitation for the interval of elements.

FIG. 7 shows a plan view of a chip 30 formed by the diffusion-type light-receiving element array. The elements for monitoring signals $R_1, R_3, \ldots, R_{2N-1}$ and the elements for monitoring noises $R_2, R_4, \ldots, R_{2N}$ are connected to corresponding bonding pads 36 through a wiring 34, respectively. As described above, the interval $p_1$ of elements is required to be larger than 50 μm.

Figure 3:
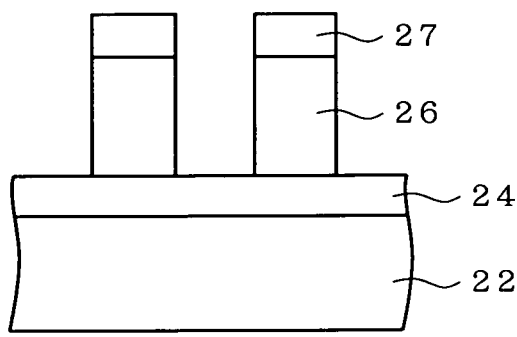
FIG. 3 is a cross-sectional view of a mesa-type light-receiving element array.
Figure 4:
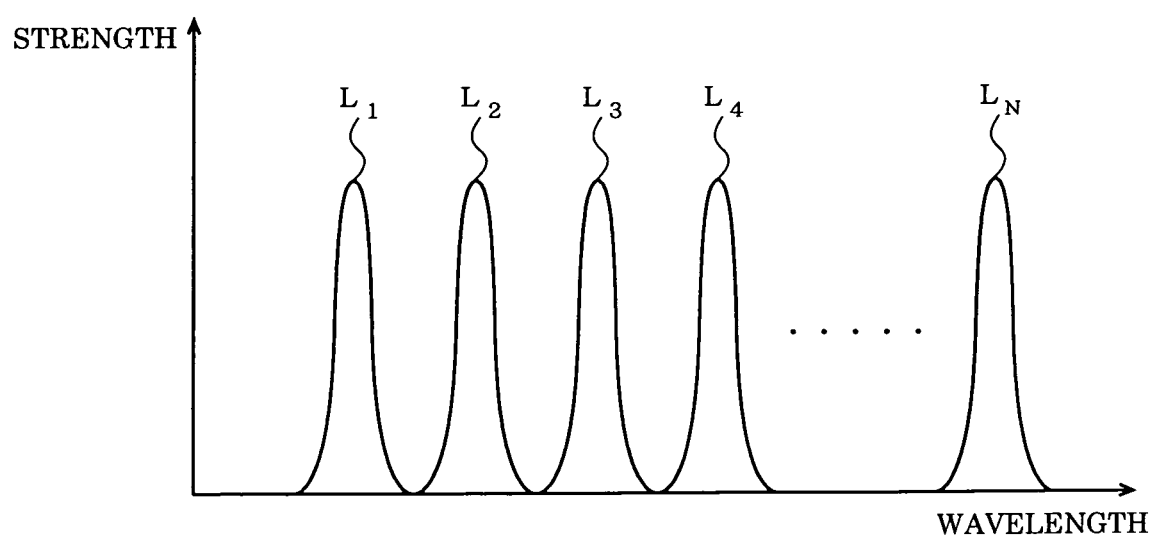
FIG. 4 is a schematic view illustrating a signal light consisting of multiplexed N channels of light.
Figure 5:
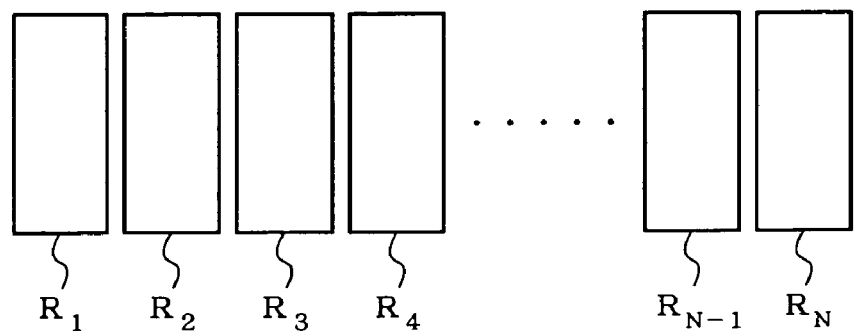
FIG. 5 is a schematic view illustrating a light-receiving element array for monitoring N channels of demultiplexed light.

The mesa-type light-receiving as described in FIG. 3 may also be used for a light-receiving element array. The mesa-type light-receiving element array may prevent the limitation of the interval of elements due to the lateral diffusion, which is the problem caused in the structure of the diffusion-type one as described above. As a result, a high-density light-receiving element array, such as 25 μm or 10 μm interval, may be provided.

Figure 8:
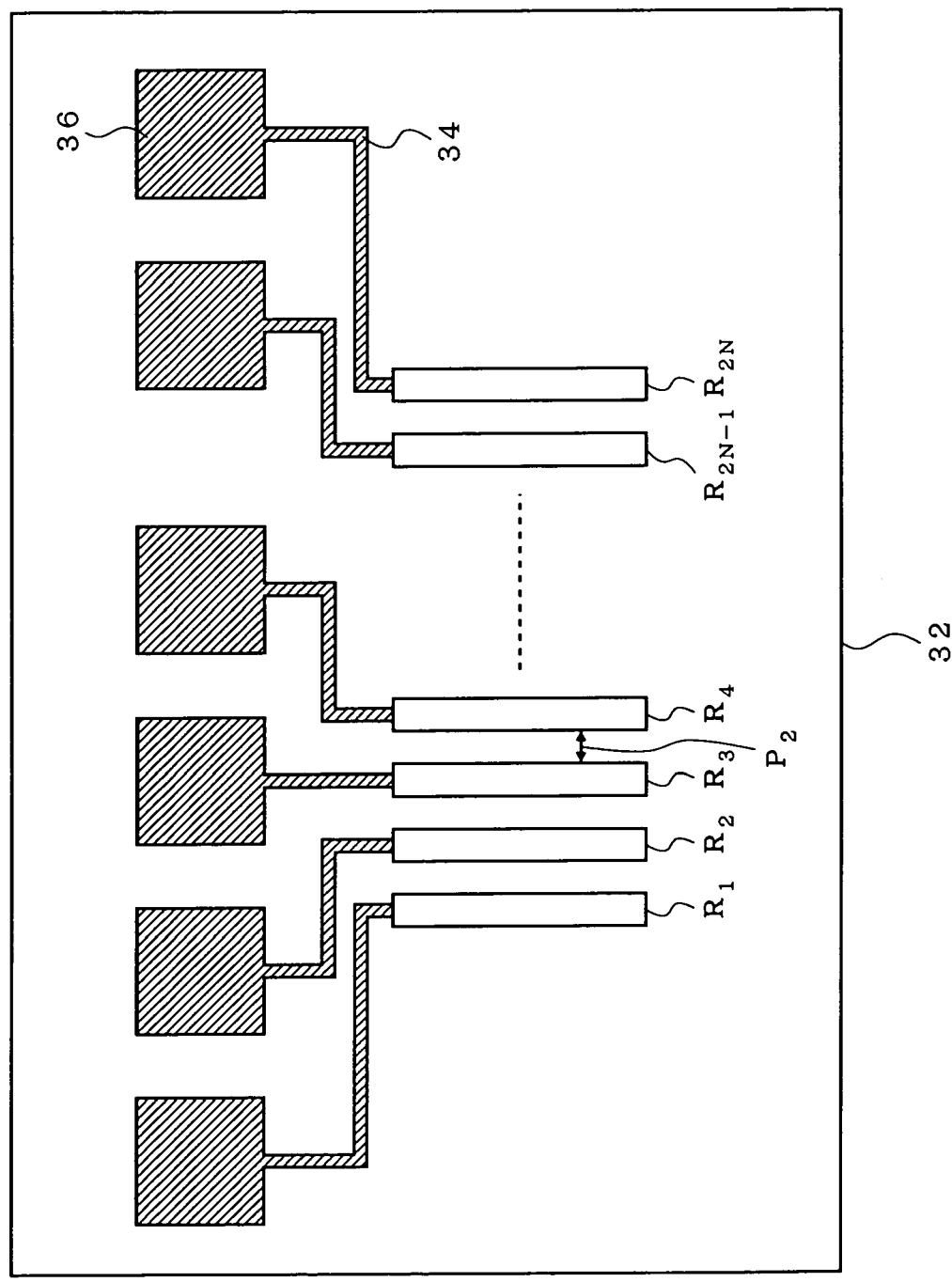
FIG. 8 is a plan view of a mesa-type light-receiving element array chip.

FIG. 8 shows a plan view of a chip 32 formed by the mesa-type light-receiving element array. As described above, the interval of elements may be small such as 10 μm.

FIG. 9 shows a circuitry for detecting N channels of signal and noises which have been separated. This detecting circuitry comprises signal monitoring differential amplifiers $D_1, D_3, \ldots, D_{2N-1}$ to one input terminal thereof the element for monitoring a signal is connected, noise monitoring differential amplifiers $D_2, D_4, \ldots, D_{2N}$ to one input terminal thereof the element for monitoring a noise is connected, and a signal/noise monitoring output circuit 40. A reference level $I_{ref}$ is connected to the other input terminal of the signal monitoring differential amplifiers $D_1, D_3, \ldots, D_{2N-1}$, and a reference level $N_{ref}$ is connected to the other input terminal of the noise monitoring differential amplifiers $D_2, D_4, \ldots, D_{2N}$. The signals and noises are monitored based on those reference levels.

Figure 10:
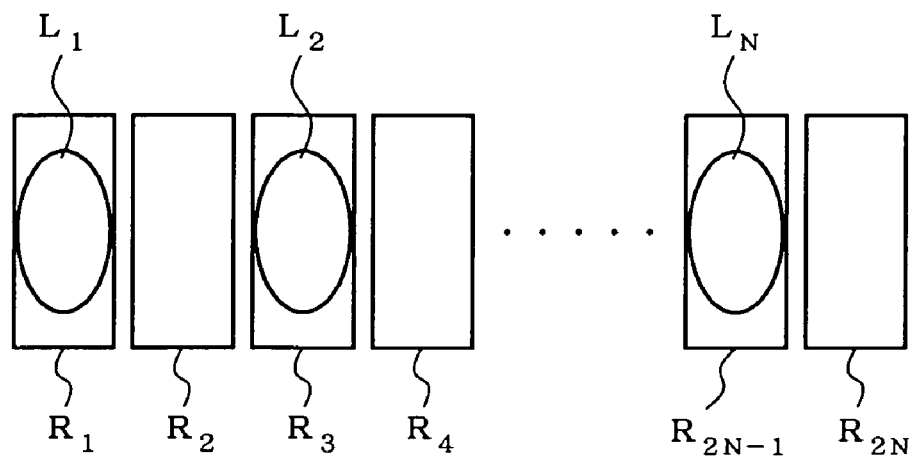
FIG. 10 is a schematic view illustrating that all the demultiplexed light beams impinge upon the light-receiving element for monitoring signals without occurring the spread of spectral width and the shift of wavelength.

The operation of the light demultiplexer of the present invention will now be described with reference to FIG. 1. The wavelength multiplexed light beam from the input optical fiber 2 is converted into a parallel light beam by the collimator lens, and the parallel light beam reaches to the diffraction grating 6. The parallel light beam is separated every wavelength into a plurality of demultiplexed beams based on the wavelength dispersion characteristic of the diffraction grating 6. The demultiplexed light beams are converted into convergent light beams, respectively, by the collimator lens 4. These convergent light beams impinge upon the photodetector 16 which is positioned at a focal point of the collimator lens 4. FIG. 10 shows that all of the demultiplexed light beams impinge upon the light-receiving elements for monitoring the signals without causing the spread of spectral width and the shift of wavelength. In this case, each differential amplifier in FIG. 9 does not output a signal, so that the signal/noise monitoring output circuit 40 does not detect the spread of spectral width and the shift of wavelength.

Figure 11:
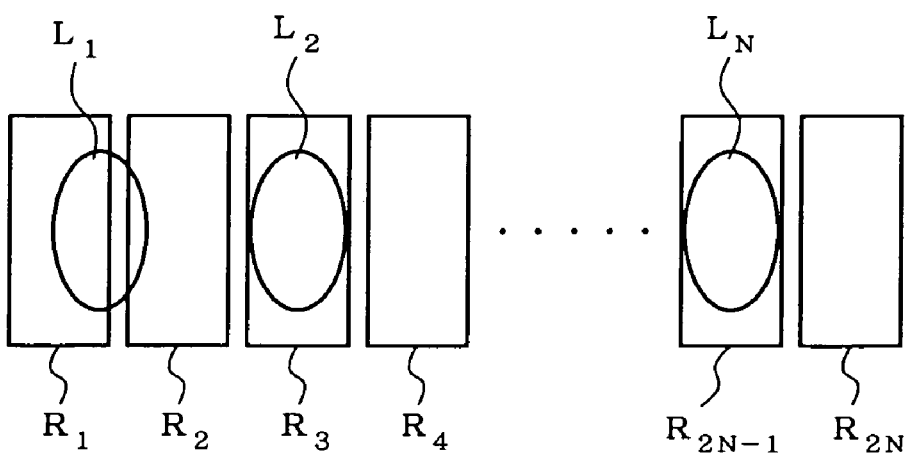
FIG. 11 is a schematic view illustrating that the peak wavelength of the demultiplexed light beam $L_1$ is shifted from the normal value.

On the contrary, FIG. 11 shows that the peak wavelength of the demultiplexed light beam $L_1$ is shifted from the normal value. As apparent from the shift condition of the demultiplexed light beam $L_1$ shown in FIG. 11, the detecting output of the light-receiving element $R_1$ for monitoring a signal is decreased, and the detecting output of the light-receiving element $R_2$ for monitoring a noise is increased.

The differential amplifier $D_1$ subtracts the reference level $I_{ref}$ from the signal output of the element $R_1$ to output it as a signal. Also, the differential amplifier $D_2$ subtracts the reference level $N_{ref}$ from the noise output of the element $R_2$ to output it as a noise. The signal/noise monitoring output circuit 40 may detect the shift of the peak position of the demultiplexed light beam $L_1$, i.e. the shift of wavelength from the outputs of the differential amplifier $D_1, D_2$.

In the light-receiving element array shown in FIG. 6, the odd-numbered elements are ones for monitoring signals and the even-numbered elements are ones for monitoring noises, but it is also possible that the even-numbered elements are ones for monitoring signals and the odd-numbered elements are ones for monitoring noises.

Also, the array including 2N elements is illustrated for simplicity in FIG. 6, but it may be possible to use only 2N elements in the array including more than 2N elements.

Also, if (2N+1) elements are used to arrange the elements for monitoring noises at both ends of the light-receiving element array, then it is preferably performed to monitor noises at first and last channels. According to this, an additional element for monitoring a noise is necessarily arranged on the left side of the element $R_1$ for monitoring a signal, so that a noise monitoring for the first channel of demultiplexed light beam $L_1$ may be implemented by means of the additional element and element $R_2$ for monitoring noises.

In the case that noises between channels is desired to be monitored, the noises between channels may be monitored by (N−1) elements for monitoring noises, so that light-receiving element array may be structured by (2N−1) elements.

SECOND EMBODIMENT

The present embodiment is directed to a light demultiplexer in which the alignment between demultiplexed light beams and light-receiving elements may be precisely implemented as well as the resolution thereof may be improved, and a light-receiving element array used for a photodetector of the light demultiplexer.

The structure of a light demultiplexer according to the present embodiment is substantially the same as that shown in FIG. 1 except a photodetector. As the photodetector 8, a light-emitting element array according to the present embodiment is used. The light-receiving element array will now be described with reference to FIG. 12. In the figure, a light-receiving array chip 48 constructed by two rows of element arrays is illustrated. One row of elements are designated by odd-numbered elements $R_1$, $R_3$, $R_5$, $R_7$, $R_9$, . . . , the other row of elements by even-numbered elements $R_2$, $R_4$, $R_6$, $R_8$, . . . . The array pitch in one row of elements is the same as that of the other row of elements, and these two rows of elements are arrayed with one-half pitch shifted.

The elements $R_1$, $R_3$, $R_5$, $R_7$, $R_9$, . . . in one row are connected to boding pads 40 arranged opposing to the elements, through a wiring 42, respectively, and the elements $R_2$, $R_4$, $R_6$, $R_8$, . . . in the other row are connected to bonding pads 44 arranged opposing to the elements through a wiring 46, respectively.

The arrangement of boding pads is illustrated above by way of example, so it may be possible that all of the bonding pads are arrayed in one row on one side of the two rows of elements, i.e. near the side edge of the light-receiving element array chip.

Figure 13:
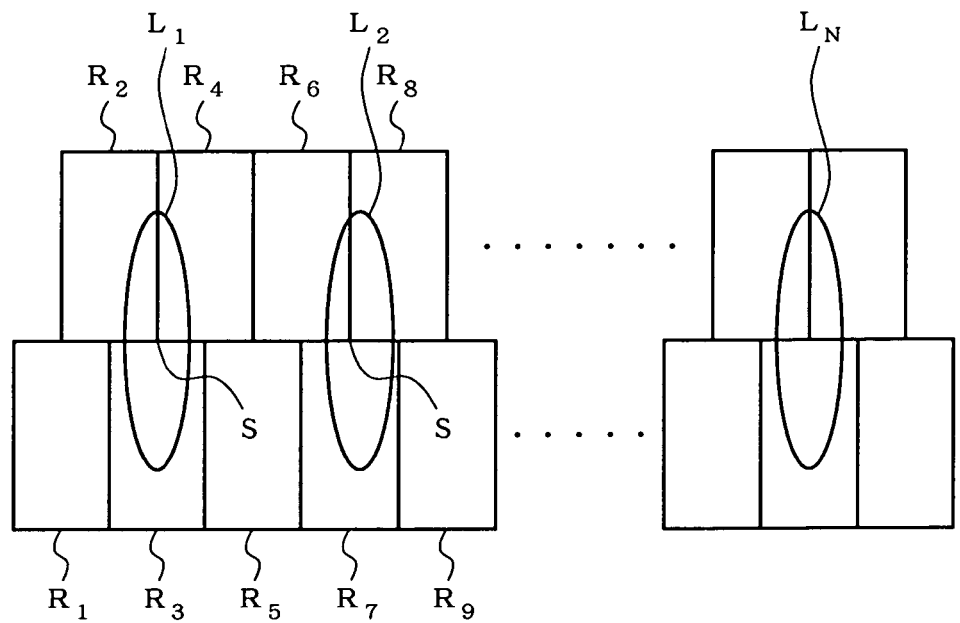
FIG. 13 is a schematic view illustrating the alignment between the light-receiving elements and the demultiplexed light beams.

Next, the alignment between the two rows of light-receiving elements arrayed with one-half pitch shifted and the demultiplexed light beams will be described. FIG. 13 shows the light-receiving element array consisting of two rows elements and the demultiplexed light beams (only the light beams $L_1$, $L_2$ and $L_N$ are designated in the figure). As apparent from the figure, each of the demultiplexed light beams impinges upon three light-receiving elements which are adjacent to each other in a direction perpendicular to an array direction of the two rows of elements. The output signals (current or voltage) from these three adjacent elements are monitored. In the light-receiving element array shown in FIG. 13, the demultiplexed light beam $L_1$ are monitored by the elements $R_2$ $R_3$, $R_4$ and the light beam $L_2$ by the element $R_6$, $R_7$, $R_8$.

According to the monitoring by means of three light-receiving elements which are adjacent to each other, the alignment of the demultiplexed light beams with respect to the light-receiving element array may be implemented at a high precision. For example, in order to align the center of the light beam $L_1$ is aligned with respect to a contact point of three adjacent elements $R_2$, $R_3$ and $R_4$, respective amounts of light detected by the elements $R_2$ and $R_4$ are caused to be the same, and the sum of the amounts of light detected by the elements $R_2$ and $R_4$ is caused to be identical with the amount of light detected by the element $R_3$. In FIG. 13, the center point of the demultiplexed light beam $L_2$ is designated to be shifted from the contact point S of the elements $R_6$, $R_7$, $R_8$. According to this demultiplexed light beam $L_2$, the respective amounts of light detected by the elements $R_6$ and $R_8$ are different, and the sum of amounts of light detected by the elements $R_6$ and $R_8$ is the same as the amount of light detected by the element $R_7$, so that it is appreciated that the light beam $L_2$ is shifted in an array direction of elements with respect to the contact point S.

Figure 14:
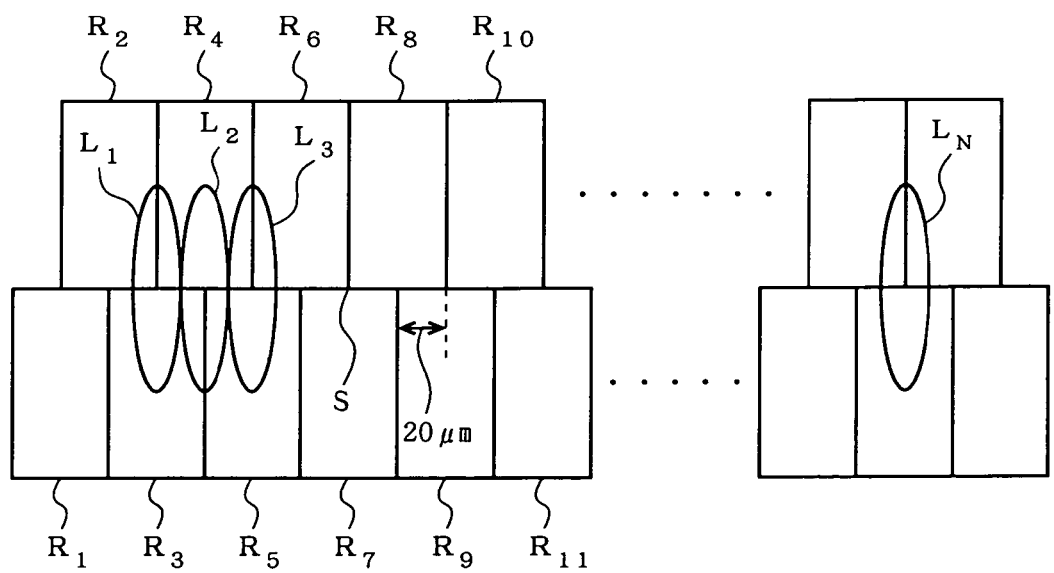
FIG. 14 is a schematic view illustrating the improvement for the resolution of the light-receiving element array.
Figure 15:
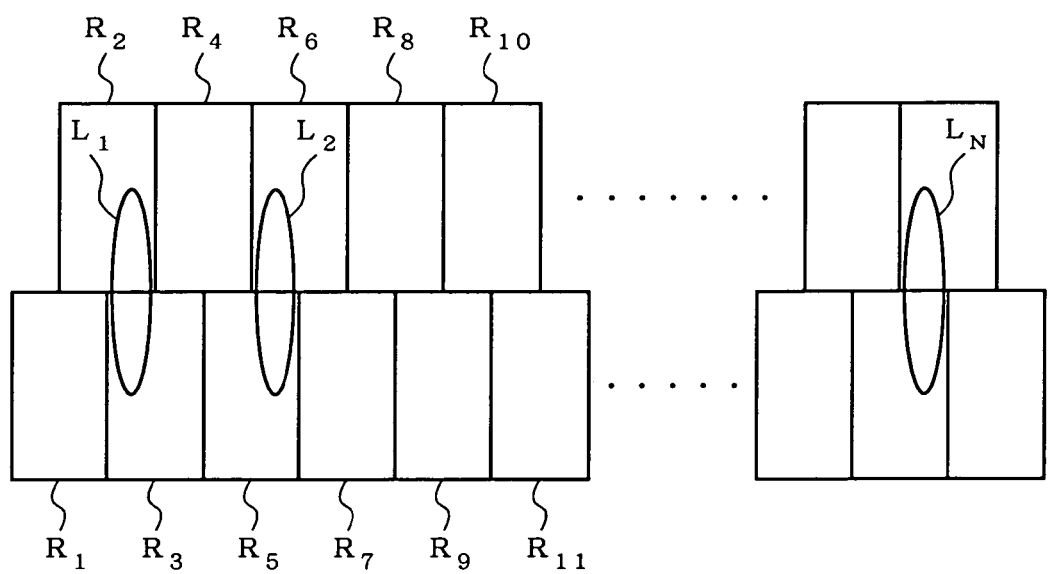
FIG. 15 is a schematic view illustrating the improvement for the resolution of the light-receiving element array.

Furthermore, the resolution of the light-receiving element array may be improved, when the light-receiving element array of the present embodiment is used. FIGS. 14 and 15 are the drawings for explanation of the improvement of the resolution. When two rows of light-receiving elements (the elements in each row are arrayed in 40 μm pitch, for example) are arrayed with one-half pitch shifted as shown in these figures, the overlap in an array direction between the element in one row and the element in the other row becomes 20 μm.

Therefore, the demultiplexed light beams $L_1$, $L_2$, . . . , $L_N$ each light beam having a width of 10 μm in an array direction of elements are caused to impinge upon the light-receiving element array in the pitch equal to one-half of an array pitch of elements, in such a manner that the center point of each light beam is caused to be positioned substantially at the contact point S of three elements which are adjacent to each other. Consequently, it is appreciated that the resolution thereof may be two times compared to the conventional array consisting of one row of light-receiving elements.

On the other hand, in the light-receiving element array in FIG. 15 which is the same as that in FIG. 14, when the demultiplexed light beam $L_1$ having a width of 10 μm in an array direction of elements is positioned at the center portion of overlap area between the element $R_2$ and $R_3$, if the position of light beam $L_1$ is shifted more than 5 μm in an array direction, then the element $R_1$ or $R_4$ which is adjacent to the element $R_2$ and $R_3$ may detect the light beam $L_1$. Therefore, the resolution may be obtained, which is the same as that in the light-receiving element array consisting of one row of elements. That is, it is appreciated that the resolution may also be increased such as two times in the arrangement of the light beams in FIG. 15.

THIRD EMBODIMENT

The present embodiment is directed to a light demultiplexer in which a crosstalk between adjacent light-receiving elements may be decreased, and a light-receiving element array used for a photodetector of the light demultiplexer.

Figure 16:
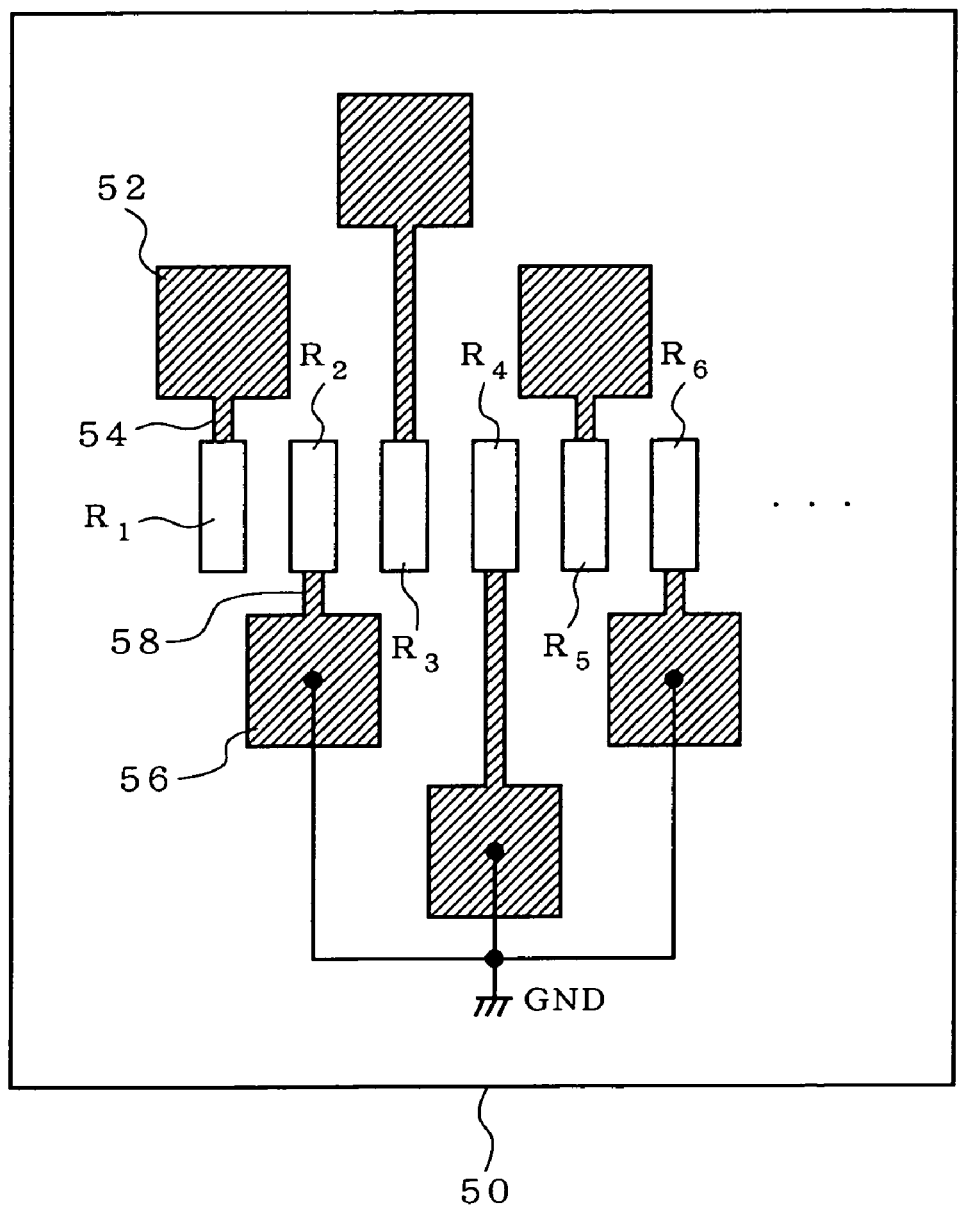
FIG. 16 is a plan view of one chip of a light-receiving element array of the third embodiment according to the present invention.

FIG. 16 is a plan view of a light-receiving element array chip 50. In the chip, a light-receiving element for monitoring a signal and a light-receiving element in which a p-type electrode and an n-type electrode thereof are shorted (hereinafter, referred to as an electrode shorted light-receiving element) are alternately arranged in turn from the left side. In the figure, the light-receiving element for monitoring a signal $R_1$, the electrode shorted light-receiving element $R_2$, the light-receiving element for monitoring a signal $R_3$, the electrode shorted light-receiving element $R_4$, the light-receiving element for monitoring a signal $R_5$, and the electrode shorted light-receiving element $R_6$ are shown in turn from the left side.

Figure 2:
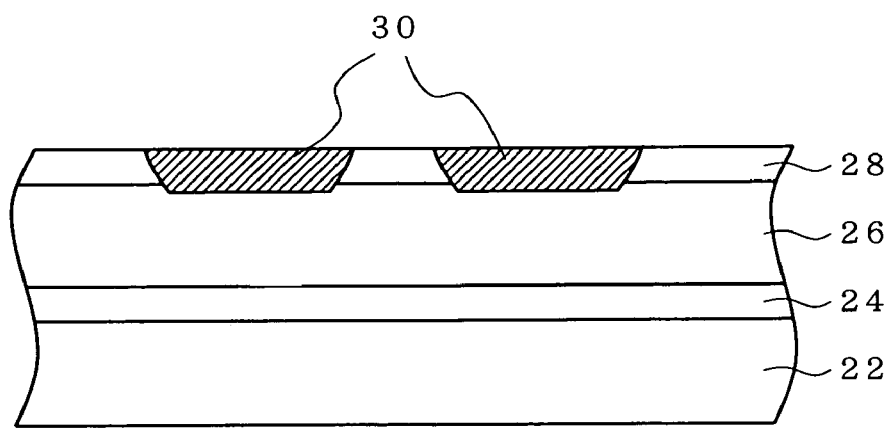
FIG. 2 is a cross-sectional view of a diffusion-type light-receiving element array.

In the diffusion-type light-receiving element array shown in FIG. 2, p-type electrodes (not shown) are provided on the p-type regions 30, respectively, and a common n-type electrode (not shown) is provided on the bottom surface of the n-type InP substrate 22. The common n-type electrode is usually grounded. Therefore, the element in which the p-type electrode is grounded is the electrode shorted element.

In the mesa-type light-receiving element array in FIG. 3, p-type electrodes (not shown) are provided on the p-type InP layers 27, respectively, and a common n-type electrode (not shown) is provided on the bottom surface of the n-type InP substrate 22. FIG. 17 shows the structure of a mesa-type light-receiving element provided with p-type electrodes 23 and an n-type electrode 25. Reference numeral 29 designates an insulting film. An n-type electrode may also be provided on the n-type InP layer 24 every light-receiving element. These n-type electrodes are usually grounded. Therefore, the light-receiving element in which the p-type electrode is grounded is an electrode shorted light-receiving element.

Returning to FIG. 16, the p-type electrodes of the light-receiving elements for monitoring signals $R_1, R_3, R_5, \ldots$ are connected to bonding pads 52 through a wiring 54, respectively. The common n-type electrode is connected to a bonding pad (not shown) which is grounded as described hereinafter. Bonding pads 56 of the electrode shorted light-receiving elements $R_2, R_4, R_6, \ldots$ are commonly connected to the ground as described hereinafter.

In order to monitor N (N is an integer of 2 or more) demultiplexed light beams by light-receiving elements, about 2N light-receiving elements are required in this embodiment. The same effect may be obtained in all the cases that the number of light-receiving elements is 2N, (2N+1) or (2N−1). In the case of (2N+1), the elements on both sides of the light-receiving element array are the electrode shorted light-receiving elements. In the case of 2N, the element on one side of the array is the electrode shorted light-receiving element. In the case of (2N−1), the elements on both sides of the array are the light-receiving elements for monitoring signals.

The light-receiving element array chip 50 described above is in effect mounted in a package. The bonding pads 52 of the light-receiving elements are connected to the leads of the package, respectively, the bonding pad (not shown) connected to the common n-type electrode is connected to one lead for grounding of the package, and the bonding pads 56 of the electrode shorted light-receiving elements are commonly connected to one or a few leads for grounding of the package. With respect to these leads, the signal detecting circuitry is connected, and such connection is implemented for forming the short circuit of electrodes on a printed circuit board.

A part of these connections may be in advance built in the light-receiving element array chip. An example of such light-receiving element array chip is shown in FIG. 18. According to the light-receiving element array chip 60 in the figure, a metal wiring pattern 70 is provided for commonly connecting the p-type electrodes of all the electrode shorted light-receiving elements in place of providing the bonding pads for the electrode shorted light-receiving elements. The metal wiring pattern 70 is connected to one lead for grounding in the package.

In the light-receiving element array chips as shown in FIGS. 16 and 18, both the light-receiving element for monitoring a signal and the electrode shorted light-receiving element have the same form, so that the size of a chip becomes large. In order to make the size small, as shown in FIG. 19, the width in an array direction of the electrode shorted elements $R_2, R_4, R_6, \ldots$ is caused to be smaller than that of the elements for monitoring signals $R_1, R_3, R_5, \ldots$ to make the array pitch of the light-receiving elements small. Also in this case, the metal wiring pattern 70 shown in FIG. 18 may be used in place of providing the boding pads 56 for the electrode shorted light-receiving elements.

In the case that the light-receiving element array illustrated in FIGS. 16, 18 and 19 is the diffusion-type light-receiving element array, the carrier diffused from the element for monitoring a signal is captured by the electrode shorted element, so that the carrier may not reach to the adjacent element for monitoring a signal. Therefore, a crosstalk may be largely decreased.

In the case that the light-receiving element array is the mesa-type light-receiving element array, if light impinges upon the electrode shorted light-receiving element, a crosstalk is not caused because there is the electrode shorted light-receiving element between the light-receiving elements for monitoring signals.

Figure 20:
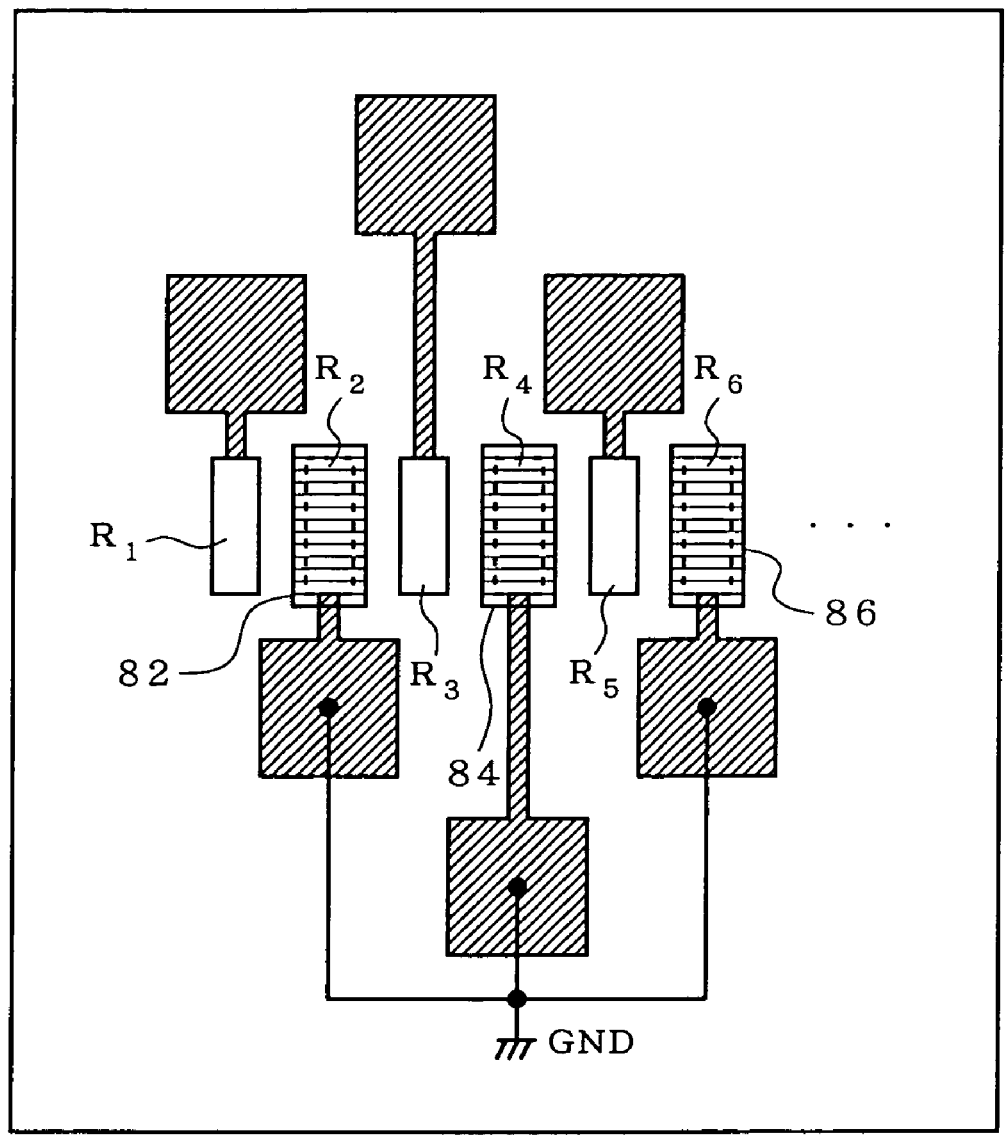
FIG. 20 is a plan view of another chip of a light-receiving element array of the third embodiment according to the present invention.

In the embodiments illustrated in FIGS. 16, 18 and 19, if light impinges upon the electrode shorted light-receiving element, then the carrier is generated. It is undesirable that the carrier is diffused into the light-receiving element for monitoring a signal to cause an undesirable current. The undesirable current is a factor of varying locally the temperature of the light-receiving element. Therefore, it is desirable that the light-receiving surface of the electrode shorted element is shielded for light in advance. The light shielding is carried out as shown in FIG. 20 by covering the light-receiving surfaces of the electrode shorted light-receiving elements $R_2, R_4, R_6, \ldots$ with the light shielding layers 82, 84, 86, . . . . The electrode shorted light-receiving elements may also be connected together by the metal wiring pattern 70 as shown in FIG. 18, and may also have a smaller light-receiving surface as shown in FIG. 19.

INDUSTRIAL APPLICABILITY

When the light-receiving element array according to the present invention is used, the light demultiplexers may be provided, such as (1) the light demultiplexer in which a signal and a noise in each channel may be distinctly separated, (2) the light demultiplexer in which the alignment between demultiplexed light beams and light-receiving elements may be precisely implemented as well as the resolution of a light demultiplexer may be improved, and (3) the light demultiplexer in which a crosstalk between adjacent light-receiving elements may be decreased.

The invention claimed is:

1. A light-receiving element array for receiving light beams demultiplexed for each wavelength from a wavelength multiplexed light beam and arranged in a straight line, wavelengths from the wavelength multiplexed light beam corresponding to respective channels, comprising:
   a plurality of light-receiving elements for monitoring signals for each of the respective channels, and
   a plurality of light-receiving elements for monitoring noises for each of the respective channels,
   wherein the light-receiving elements for monitoring signals and the light-receiving elements for monitoring noises are alternately arrayed in a straight line, a direction thereof being the same as that of an arrangement of the demultiplexed light beams, and wherein the light-receiving elements for monitoring noises are positioned relative to the light-receiving elements for monitoring signals such that a signal shift of a monitored signal results in the monitored signal being received concurrently by one of the light-receiving elements for monitoring signals and by one of the light-receiving elements for monitoring noises.

2. The light-receiving element array according to claim 1, wherein the light-receiving elements for monitoring signals and the light-receiving elements for monitoring noise comprise pin-photodiodes, respectively.

3. A light demultiplexer, comprising:
   a light-receiving element array according to claim 1 or 2 for receiving the light beams demultiplexed for each wavelength from the wavelength multiplexed light beam and arranged in the straight line,
   wherein the signals and noises for each of the respective channels are separated to be monitored by the light-receiving element array.

* * * * *